United States Patent [19]

Mathiprakasam

[11] Patent Number: 4,634,803

[45] Date of Patent: Jan. 6, 1987

[54] METHOD OF OBTAINING OPTIMUM PERFORMANCE FROM A THERMOELECTRIC HEATING/COOLING DEVICE

[75] Inventor: Balakrishnan Mathiprakasam, Overland Park, Kans.

[73] Assignee: Midwest Research Institute, Kansas City, Mo.

[21] Appl. No.: 705,109

[22] Filed: Feb. 25, 1985

[51] Int. Cl.$^4$ ............................................. H01L 35/28
[52] U.S. Cl. .................................. 136/212; 136/201; 136/205
[58] Field of Search ............... 136/201, 203, 204, 205, 136/208-212, 224-227

[56] References Cited

U.S. PATENT DOCUMENTS

| | | | |
|---|---|---|---|
| 3,243,869 | 4/1966 | Sandberg | 136/201 |
| 3,390,018 | 6/1968 | Habdas | 136/212 |
| 3,601,887 | 8/1971 | Mitchell et al. | 136/201 |
| 4,443,650 | 4/1984 | Takagi et al. | 136/201 |
| 4,444,991 | 4/1984 | Beale | 136/201 |
| 4,465,895 | 8/1984 | Verner et al. | 136/201 |

*Primary Examiner*—John F. Terapane
*Assistant Examiner*—T. J. Wallen
*Attorney, Agent, or Firm*—Kokjer, Kircher, Bradley, Wharton, Bowman & Johnson

[57] ABSTRACT

A method of selecting optimum values for the factors H and $\mu$ in a thermoelectric heating/cooling device. A system model is formulated by relating the heat transfer characteristics of the heat exchangers on the hot and cold sides of the device to the thermoelectric properties of the TE couples. The model yields a set of governing differential equations that take into account the relative flow directions of the fluids and the position dependence of the temperatures. The equations can be solved and the solutions used in an iterative procedure to select optimum values of H and $\mu$ that will meet the specified heating or cooling requirements. In a less rigorous method, the average temperatures on the hot and cold sides of the device are used, and these temperatures are mathematically expressed by equations that normally provide results within acceptable margins of error.

4 Claims, 2 Drawing Figures

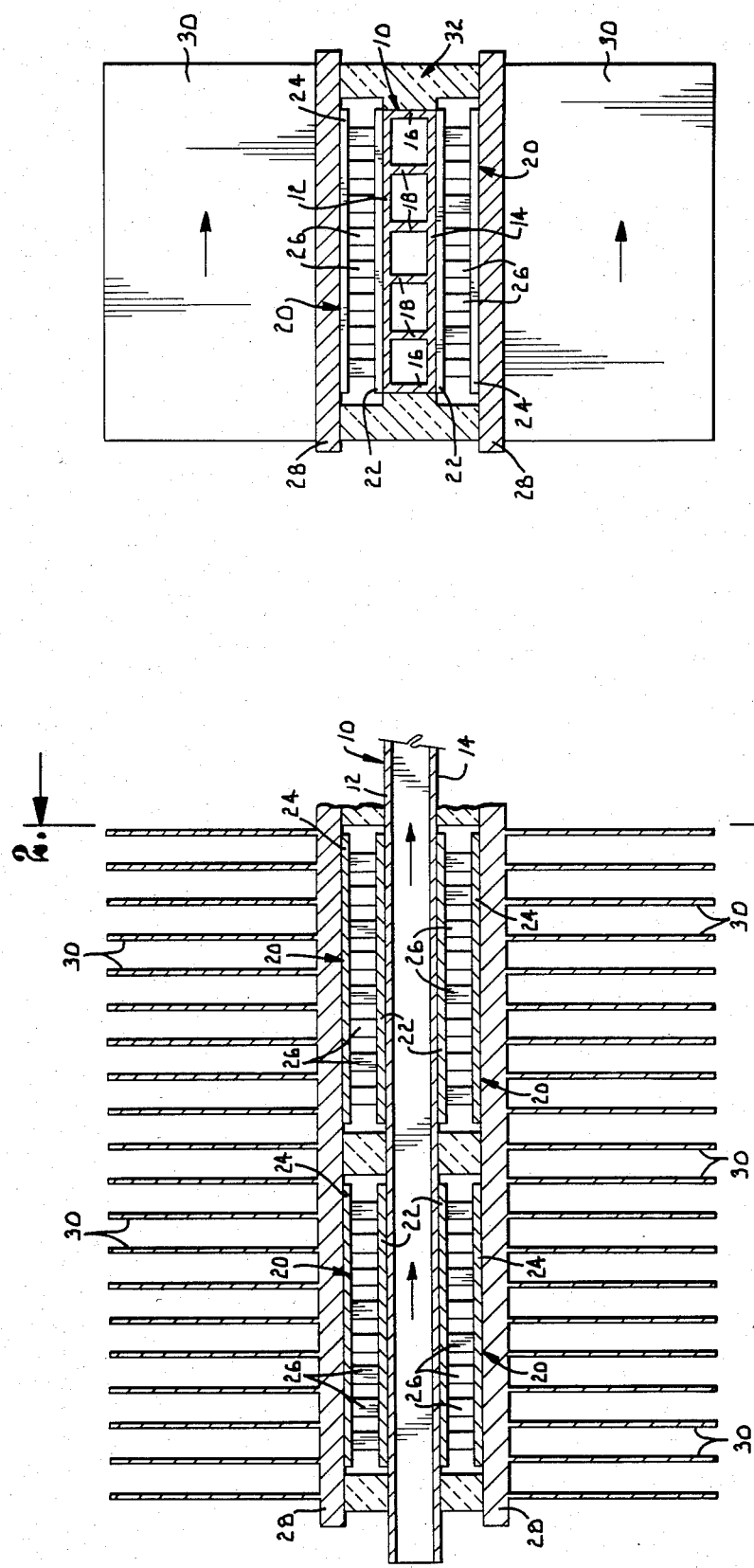

METHOD OF OBTAINING OPTIMUM PERFORMANCE FROM A THERMOELECTRIC HEATING/COOLING DEVICE

This invention was made with Government support under contract number DAAK50-83-K-001 awarded by the United States Army. The Government has certain rights in this invention.

BACKGROUND OF THE INVENTION

This invention relates generally to thermoelectric heating and cooling and more particularly to an improved method of designing thermoelectric device so that it exhibits the best possible performance characteristics.

Thermoelectric heating and cooling devices operate on the basis of a thermodynamic principle known as the Peltier effect. This phenomenon results in the generation of a temperature difference between junctions of two dissimilar materials when a direct current is passed through the materials. One junction is increased in temperature and can transfer heat to a fluid passed in thermal contact with it. The other junction is cooled and can absorb heat from a fluid. Thus, a thermoelectric device can be operated as a heat pump and has the advantage of solid state components because of the absence of moving parts.

The heat pumping capacity of two dissimilar thermoelectric materials, referred to as a couple, is usually very small so that it is necessary in actual practice to combine a number of couples to form a component known as a thermoelectric module. The number of couples in a module can vary widely and is typically between 3 and 127. A practical thermoelectric device normally requires between 10 and 100 modules in order to meet the heat pumping requirements. The heat which is delivered to the hot faces of the thermoelectric modules is transferred to a fluid passed through a hot side heat exchanger, while another fluid is passed through a cold side heat exchanger to transfer heat from the fluid to the cold faces of the modules.

Different thermoelectric devices may vary widely in configuration, depending upon numerous factors such as the types of fluids used (gas and liquid, gas and gas, or liquid and liquid) and the main purpose of the device (heating only, cooling only, or both heating and cooling). However, in essence, all thermoelectric devices include a closed channel for the process fluid and a number of thermoelectric modules each having one face (hot or cold) in thermal contact with the channel. The other face of each module is in thermal contact with the surfaces of a heat exchanger which receives a second fluid and which normally has fins or other elements that promote heat transfer. The heat exchanger is usually an open flow unit.

In the past, the design of thermoelectric heating/cooling devices for a particular application has been based merely on the characteristics of the thermoelectric properties of the modules. To my knowledge, attempts have not been made to interface or interrelate the thermoelectric characteristics with the heat transfer processes which occur on the hot and cold sides of the modules. Thus, the fact that the process fluid and the other fluid both undergo temperature changes as they flow through the process channel and heat exchanger, respectively, is not taken into account, and significant errors can result.

In accordance with conventional practice, single stage thermoelectric devices are designed by making certain assumptions. The thermoelectric property values, such as the Seebeck coefficient ($\alpha$), the electrical resistivity ($\rho$) and the thermal conductivity (k) of the materials, are assumed to be constant and are taken at the mean of the hot junction temperature and cold junction temperature.

The conventional method used to design the components of thermoelectric devices involves two phases, the first of which entails three steps having the purpose of determining the optimum values of the major thermoelectric design factors herein represented by the symbols H and $\mu$. The factor H is given by the equation $$H = I/v \qquad (1)$$

where I is the current flow through a couple and $v$ is the ratio of the cross-sectional area of a thermoelectric element to its height. The second factor $\mu$ is defined by the equation $$\mu = nv \qquad (2)$$

where n is the total number of thermoelectric couples required in the device to satisfy the design requirements for heating and/or cooling. It is highly important that the factors H and $\mu$ be optimally designed, because even small errors or allowances in either factor can significantly affect the performance of the thermoelectric device.

The first step in the conventional design process is to estimate the average temperature of the hot junction ($T_h$) and the average temperature of the cold junction ($T_c$) of the thermoelectric modules. There is no accepted method for determining these values, and various approximations are made based on factors such as the inlet temperatures of the process fluid and the second fluid, the heat transfer rate of the process fluid channel, and the heat transfer rate of the heat exchanger. Because of the lack of any established procedure for arriving at an accurate estimation of the values for $T_h$ and $T_c$, the values that are used for these temperatures are often considerably different from the temperatures that are experienced in the actual device. Consequently, this step in the conventional design procedure often leads to significant errors.

The second step involves calculating the optimum values of H depending upon whether the system is designed to deliver the highest possible coefficient of performance (COP) or the highest possible heating/cooling capacity. To obtain maximum COP, the optimum value of H can be calculated by solving the equation:

$$H = \alpha(T_h - T_c)/[\rho(w-1)], \qquad (3)$$

where $w = [1 + \alpha^2(T_h + T_c)/2\rho k]^{\frac{1}{2}}$.

To obtain maximum cooling capacity, the optimum value of H is given by:

$$H = \alpha T_c/\rho \qquad (4)$$

The final step in the first phase of the conventional design procedure is to calculate the values for $\mu$, the total power required (P) and the COP by the following equations:

$$\mu = Q_c/[\alpha T_c H - \tfrac{1}{2} H^2 \rho - k(T_h - T_c)] \qquad (5)$$

$$P = \mu[\alpha(T_h - T_c)H + H^2\rho] \quad (6)$$

$$COP = Q_c/P \quad (7)$$

where $Q_c$ is the desired cooling capacity.

The second phase of the conventional procedure involves calculating the number of couples (n) required in the device. This calculation is made in the same manner as in the procedure of the present invention, which will subsequently be described.

The primary conceptual problem with the conventional procedure is its failure to account for the changes in temperature that occur in the process fluid and the second fluid as they travel through the process stream channel and the heat exchanger, respectively. For example, if the process fluid is cooled, its temperature decreases continuously as it passes through the process channel. Conversely, the second fluid increases continuously in temperature as it moves past the fins of the heat exchanger. Because of this spatial variation in the temperatures of the fluid, the temperatures of the hot and cold sides of the thermoelectric modules are position-dependent. Thus, the hot junction temperature is not one single value and the cold junction temperature is likewise not a single fixed value. Because the conventional method of design involves assumptions that these temperatures are constant when in fact they are not, errors inevitably occur and the dimensions of the thermoelectric elements in the module are no optimum for the device.

SUMMARY OF THE INVENTION

The present invention provides an improved method of selecting values for the factors H and $\mu$ in a thermoelectric device more accurately than has been possible in the past. In accordance with the invention, two different approaches can be taken, one of which is more rigorous than the other. The rigorous method involves first formulating a system model which provides a set of governing heat balance equations based on certain assumptions. The governing equations take into account the fact that the temperatures on the hot and cold sides of the thermoelectric device vary with position, and they also reflect the relative direction of flow of the two fluids on the hot and cold sides. The equations are differential equations which can be solved by suitable mathematical techniques. The solutions of the applicable equations can be used, together with iterative techniques, to select the optimum values of H and $\mu$ for the highest possible efficiency or highest possible capacity, depending upon the system requirements. Once the factors H and $\mu$ have been determined, the dimensions of the thermoelectric elements and their arrangement in modules can be selected.

The less rigorous method is simplified in that it avoids the necessity to solve differential equations. However, some accuracy is sacrificed for the sake of simplicity. The simplified method nevertheless provides results that are within acceptable margins of error, due to the accurate manner in which the average temperatures on the hot and cold sides of the modules are expressed in mathematical terms. The use of average values for the hot and cold side temperatures, rather than continuously variable values in accordance with the rigorous method, introduces errors that are typically less than 6%. Thus, the simplified method is often entirely satisfactory, although the more rigorous method is still preferred and is virtually essential in situations where accuracy is of the utmost importance.

DETAILED DESCRIPTION OF THE INVENTION

In the accompanying drawing which forms a part of the specification and is to be read in conjunction therewith and in which like reference numerals are used to indicate like parts in the various views:

FIG. 1 is a cross-sectional view of a representative thermoelectric device which (along with many other different devices) may be designed according to the principles of the present invention; and FIG. 2 is a sectional view taken generally along line 2—2 of FIG. 1 in the direction of the arrows.

Referring to the drawing in more detail, the thermoelectric device designed in accordance with the present invention heats or cools a process fluid stream which is passed through an enclosed conduit 10. The process fluid may be liquid or gas, and it may be heated or cooled by the thermoelectric device. For purposes of illustrating the principles of the present invention, it is assumed that the process fluid that flows through the conduit 10 is cooled by the thermoelectric device. As best shown in FIG. 2, the conduit 10 is rectangular and has flat top and bottom surfaces 12 and 14 connected by end walls 16 and by a plurality of partitions 18 which enhance the transfer of heat from the process fluid to the conduit. The conduit 10 may have many other shapes and may be provided with fins, serrations or another type of element which enhances the heat transfer.

The thermoelectric device includes a plurality of thermoelectric modules 20 each constructed in the same manner. Each module 20 has a cold face connected to a flat ceramic plate 22 and a warm face connected to another flat ceramic plate 24. A plurality of thermoelectric elements 26 extend between plates 22 and 24. The cold plates 22 of modules 20 are adjacent to the top and bottom surfaces 12 and 14 of conduit 10. The warm plates 24 are adjacent to additional plates 28 which form the bases of heat exchangers. A plurality of fins 30 (or any other heat promotors) project from each plate 28. Air or another fluid is directed past the fins 30 in a direction perpendicular to the flow of the process fluid in order to extract heat from the fins. Plates 28 are separated from one another and from conduit 10 by suitable insulation 32.

Because the fluid which cools the heat exchanger formed by plates 28 and fins 30 flows transversely to the process fluid in channel 10, the arrangement shown in the drawing is referred to as a cross flow arrangement. Other types of arrangements are referred to as parallel flow, where the two fluids flow parallel to one another, and counterflow, where the two fluids flow counter to one another in opposite directions. The present invention is not limited to any particular flow direction and is applicable to cross flow, parallel flow and counterflow systems.

In accordance with the present invention, the process in which heat is pumped from the process fluid in channel 10 to the second fluid which is forced past fins 30 can be expressed in terms of sets of differential equations which can be solved and used in the selection of optimum values of H and $\mu$, depending upon whether the thermoelectric device is to exhibit maximum efficiency or minimum size and weight. The mathematical model for the thermoelectric system is formulated on the basis of five assumptions which are usually accurate enough to prevent significant error.

First, it is assumed that the thermoelectric device operates at constant pressure and that the physical properties of the heat transfer fluids (such as density and specific heat) are constant and do not vary with temperature.

Second, it is assumed that the properties of the thermoelectric materials (such as the Seebeck coefficient, electrical resistivity and thermal conductivity) are constant and do not vary with temperature. If $T_i$ is the inlet temperature of process fluid and $T_a$ is the inlet temperature of the second fluid, then the property values at $(T_i+T_a)/2$ can be used as the average, constant values.

Next, it is assumed that the device operates under steady state conditions.

It is also assumed that the thermoelectric system is perfectly insulated so that there are no heat losses to and from the surrounding environment.

Finally, it is assumed that the thermoelectric modules are uniformly spaced over all of the heat transfer surfaces so that the heat flux is uniformly distributed on the hot and cold sides of the modules.

Based on these assumptions, the heat balance can be expressed by the following pairs of differential equations where the process fluid is to be cooled, depending upon whether the device has a parallel flow, countercurrent flow or cross flow configuration:

For parallel flow operation, $$C_1L(dT_1/dx)/\mu = -\alpha T_c H + \tfrac{1}{2}H^2\rho + k(T_h-T_c) = H_1(T_c-T_1)/\mu \quad (8)$$

$$C_2L(dT_2/dx)/\mu = \alpha T_h H + \tfrac{1}{2}H^2\rho - k(T_h-T_c) = H_2(T_h-T_2)/\mu \quad (9)$$

For counterflow operation, $$C_1L(dT_1/dx)/\mu = \alpha T_c H - \tfrac{1}{2}H^2\rho - k(T_h-T_c) = H_1(T_1-T_c)/\mu \quad (10)$$

$$C_2L(dT_2/dx)/\mu = \alpha T_h H + \tfrac{1}{2}H^2\rho - k(T_h-T_c) = H_2(T_h-T_2)/\mu \quad (11)$$

For cross flow operation, $$C_1L_1(\delta T_1/\delta x)/\mu = -\alpha T_c H + \tfrac{1}{2}H^2\rho + k(T_h-T_c) = H_1(T_c-T_1)/\mu \quad (12)$$

$$C_2L_2(\delta T_2/\delta x)/\mu = \alpha T_h H + \tfrac{1}{2}H^2\rho - k(T_h-T_c) = H_2(T_h-T_2)/\mu \quad (13)$$

In these equations, $C_1$ is the heat capacity (specific heat times mass flow rate) of the process fluid, $C_2$ is the heat capacity of the second fluid, H is the ratio $I/v$, $H_1$ is the heat transfer rate on the cold or process fluid side of the thermoelectric modules, $H_2$ is the heat transfer rate on the hot or second fluid side of the modules, k is the thermal conductivity of the thermoelectric couple, L is the fluid flow length, $L_1$ and $L_2$ are the process fluid flow length and second fluid flow length, respectively (which differ only in the cross flow configuration), $T_1$ is the process fluid temperature at any location, $T_2$ is the second fluid temperature at any location, $T_c$ is the cold junction temperature at any location, $T_h$ is the hot junction temperature at any location, x is the coordinate in the direction of process fluid flow, y is the coordinate in the perpendicular direction, $\alpha$ is the Seebeck coefficient of the couple, $\rho$ is the electrical resistivity of the couple, and $\mu$ and $v$ are as defined earlier.

Thus, which pair of differential equations is applicable depends upon the direction of flow of the process fluid relative to the second fluid. The applicable pair of equations can be solved simultaneously using conventional mathematical techniques. The inlet temperature ($T_i$) of the process fluid and the inlet temperature ($T_a$) of the second fluid are known and provide the inlet conditions. The exit or outlet temperature ($T_e$) of the process fluid and the exit or outlet temperature ($T_b$) of the second fluid are the results available from the solution, expressed in terms of H and $\mu$ and the properties of the thermoelectric elements and heat transfer fluids.

Using the solution of the proper set of differential equations, the cooling capacity ($Q_c$), heating capacity ($Q_h$), electric power requirements (P) and coefficient of performance (COP) can be determined as follows:

The heat extracted from the process fluid (cooling capacity) is given by $$Q_c = C_1(T_i - T_e) \quad (14)$$

The heat rejected to the second fluid is given by $$Q_h = C_2(T_b - T_a) \quad (15)$$

The electric power required to operate the device is given by $$P = Q_h - Q_c \quad (16)$$

Finally, the cooling coefficient of performance is given by $$\text{COP} = Q_c/P \quad (17)$$

The method of using the foregoing equations and principles to determine the optimum value of H and the corresponding optimum value of $\mu$ for a thermoelectric device to deliver the specified cooling capacity at the highest possible COP in situations where efficiency is of paramount importance is described later. Likewise, the method of finding the values of H and $\mu$ for the device to deliver the maximum cooling capacity, or the specified cooling capacity with the minimum size and weight of the unit is also described later. Once the values of H and $\mu$ have been determined, the values for the other factors can be calculated without great difficulty, so the proper selection of H and $\mu$ is the key procedure which must be carried out accurately in order to avoid significant errors in the performance exhibited by the device.

The iterative techniques which will now be described apply to a device used for cooling of the process fluid. It is to be understood that these techniques are also applicable to a device used to heat.

In order to determine the values of H and $\mu$ which will allow the device to deliver a specified cooling capacity at the highest possible COP, the basic specifications and properties of the thermoelectric materials and heat transfer fluids are first collected. These include $H_1$ (including the conduction resistance of channel 10 and the bonding material and the convection resistance of the process fluid), $H_2$ (again including the conduction and convection resistances), $C_1$ and $C_2$ and $T_i$ and $T_a$, the initial temperatures of the process and second fluids. The thermoelectric property values ($\alpha$, $\rho$ and k) should be estimated. These are temperature dependent and can be selected at a temperature of $(T_i+T_a)/2$ which is the average of the inlet temperatures.

Next, a reasonable value for H is assumed and various values of $\mu$ are assumed. Using the solution to the applicable set of differential equations (8)–(9), (10)–(11), or (12)–(13), along with equation $Q_c = C_1(T_i - T_e)$, the values of $Q_c$ are determined for the assumed value of H and each of the assumed values of $\mu$. Then, the one value of $\mu$ which, together with the assumed value of H, corresponds to the specified $Q_c$ is selected. This procedure results in one value of H and a corresponding value of $\mu$ which can deliver the specified cooling capacity. It is possible that the assumed value of H may be too low or too high to deliver the specified cooling capacity with any value of $\mu$, and in this case, the assumed value of H should be discarded and a different value of H should be assumed. From equations 15–17, the COP can be calculated for the assumed value of H and the corresponding value of $\mu$.

Another value of H is then assumed, and the foregoing procedure is repeated for this value of H to determine the corresponding value of $\mu$ which delivers the specified cooling capacity. The COP for the second assumed value of H and the corresponding value of $\mu$ is calculated using equations 15–17.

The procedure is thereafter repeated until a number of assumed values of H have been selected and the corresponding values of $\mu$ and COP have been determined. This data can be arranged in tabular form if desired. Then, the value of H which corresponds to the maximum value of COP is selected along with the corresponding value of $\mu$, and these will be the optimum values for H and $\mu$ which meet the specified cooling requirements at the maximum COP.

Although it is possible in principle for all of the thermoelectric couples to be connected in series, this type of arrangement can result in dimensions for the elements which are too small to permit economical manufacture. Therefore, it is more common for the elements to be arranged in a number of strings connected in parallel, with each string including a number of couples in series. If m strings are selected, then each string includes n/m couples in series and the m strings each receive the supply voltage (V).

The electrical relationship is then given by $$P = VIm = VH\upsilon m \qquad (18)$$

Since V and m are known, H has been determined and P can be calculated from equation 16, the value of $\upsilon$ can be calculated from equation 18. Since $\mu$ and $\upsilon$ are determined and are related by the equation $\mu = n\upsilon$, the total number of couples n in the device can be determined. It should be noted that the number of modules which contain the n couples can be selected at the option of the person designing the unit. Also, the designer can select cross sectional area (A) and the length (l) of each unit, so long as they satisfy the equation $\upsilon = A/l$.

To exemplify the foregoing, the practical problem of designing a thermoelectric device can be considered wherein the process fluid has a heat capacity ($C_1$) of 28 W/k and is to be cooled from 304k ($T_i$) to 293.3k ($T_e$). The average heat transfer rate of the process channel 10 ($H_1$) is 150 W/k, and the hot side heat transfer rate ($H_2$) is 75 W/k. The second fluid enters the heat exchanger at 330k ($T_a$) and has a heat capacity ($C_2$) of 800 W/k. A cross flow configuration is used. The thermoelectric properties at 317k[(330+304)/2] are $\alpha = 433.3$ $\mu$V/k, $\rho = 0.002363$ (including strap resistance and ripple factor) and k=0.32285 W/cmk (including contact thermal resistances). $Q_c = C_1(T_i - T_e) = 300W$.

By using the procedure described above, the data of Table 1 can be generated.

TABLE 1

| VALUES OF H AND $\mu$ WHICH CAN PROVIDE 300 W COOLING | | |
|---|---|---|
| H | $\mu$ | COP |
| 20 or less | cannot provide 300 W at any $\mu$ | |
| 21 | 477.9 | 0.4248 |
| 22 | 410.4 | 0.4590 |
| 23 | 366.4 | 0.4772 |
| 24 | 333.9 | 0.4871 |
| 25 | 308.8 | 0.4905 |
| 26 | 288.2 | 0.4910 |
| 27 | 271.5 | 0.4874 |
| 28 | 257.4 | 0.4821 |

From Table 1, it is evident that the maximum COP is 0.4910 and that the values of H and $\mu$ which correspond to this COP are 26 and 288.2, respectively. The electrical power needed to operate the device is $P = Q_c/COP = 300/0.4910 = 611$ W. It should be noted that the optimum value of H can be refined to one or several decimal places, although selecting the closest integer gives results which are sufficient in actual practice.

Assuming that the supply voltage V is 28 V and that 6 strings are selected (m=6), equation 18 gives a value for $\upsilon$ of 0.1399. The total number of thermoelectric couples required is $n = \mu/\upsilon = 288.2/0.1399 = 2060$. Using 42 modules each containing 49 couples results in a total of 2058 couples which is for all practical purposes equal to the required number of 2060. Adjusting the value of $\upsilon$ provides $\upsilon = 288.2/2058 = 0.14$, and this can be obtained by using elements having a cross sectional area (A) of 0.0466 cm$^2$ and a length (l) of 0.333 cm, for example.

The design method described above can be used with modifications to design for maximum cooling capacity. If the thermoelectric device is to have its size and weight minimized instead of having its efficiency maximized, the values of $H_1$ and $H_2$ should be decreased as much as possible (to decrease the size and weight) while still permitting the device to meet the specified cooling requirements. In the example problem given above, it has been determined that 300 W cooling power can be obtained at a maximum COP of 0.491 with $H_1 = 150$ W/k and $H_2 = 75$ W/k. If $H_1$ and $H_2$ are to be minimized to minimize the size and weight, the differential equations 12 and 13 (for cross flow operation) can be solved and the solutions can again be used to interactively determine the lowest values of $H_1$ and $H_2$ that suffice for 300 W cooling capacity. For example, if $H_1$ and $H_2$ are to be decreased proportionately (so $H_1/H_2 = 2$ for all values of $H_1$ and $H_2$), the value of $H_1$ can be successively decreased from 150, and the maximum cooling capacity ($Q_c$) can be calculated for each value of $H_1$ and the corresponding value of $H_2$.

By using the iterative procedure described above, the data shown in TABLE 2 can be generated for the optimum values of H and $\mu$ for values of $H_1$ from 108 to 100.

TABLE 2

H and μ VALUES FOR SEVERAL VALUES OF $H_1$
(Maximum Cooling Capacity)

| $H_1$ | H  | μ   | $Q_c$ |
|-----|----|-----|-------|
| 108 | 35 | 336 | 306.7 |
| 107 | 35 | 334 | 304.5 |
| 106 | 35 | 331 | 302.3 |
| 105 | 35 | 328 | 300.0 |
| 104 | 35 | 326 | 297.8 |
| 103 | 35 | 323 | 295.6 |
| 102 | 35 | 320 | 293.3 |
| 101 | 35 | 317 | 291.1 |
| 100 | 35 | 315 | 288.8 |

From the data in TABLE 2, it is evident that a cooling capacity of 300 W can be obtained with $H_1$ having a value of 105. The corresponding optimum values of H and μ are 35 and 328, respectively.

Once the values of H and μ have been selected in this manner, the number and size of the thermoelectric elements can be determined in the same fashion described in connection with the design for maximum COP. Thus, with V known, H and m known and P given by equation 16, the relationship P=VHυm given by equation 18 can be solved for υ. Since μ=nυ and μ and υ are known, the value of n can be determined.

Because the foregoing procedure takes into account the fact that the temperatures are different at different areas of the thermoelectric device, and it also recognizes the relative flow directions of the process and second fluids, it provides more accurate results than the conventional method of designing thermoelectric devices. Consequently, the values of H and μ are optimum, for either maximum COP or maximum capacity, and the thermoelectric device exhibits optimum performance characteristics.

The foregoing procedure is a rigorous and elaborate method of design which requires the ability to solve differential equations (partial differential equations in the case of cross flow operation). Accordingly, the method is highly accurate but is complex and rather difficult for those lacking extensive skills in solving differential equations. I have found that a modified and simpler method can be used by those who are less skilled in the solution of differential equations. Because the simplified method does not take into account the relative flow directions of the fluids and uses average values for the hot and cold junction temperatures rather than the varying position dependent values used in the more rigorous method, accuracy is sacrificed to some extent. However, the average values of the junctions are accurate enough to lead to errors of less than 6% in the key parameters H and μ, and this relative small error is often acceptable in view of the greater simplicity allowed by the simplified method.

In accordance with my simplified method, accurate approximations for the average cold junction temperature $T_c$ and the average hot junction temperature $T_h$ are expressed by the following equations:

$$T_c = T_i - Q_c/2C_1 - Q_c/H_1 \qquad (19)$$

and $$T_h = T_a + Q_h/2C_2 + Q_h/H_2 \qquad (20)$$

Additional thermoelectric relationships that can be used to calculate the parameters of an actual thermoelectric device are:

$$Q_c = \mu[\alpha T_c H - \tfrac{1}{2}H^2\rho - k(T_h - T_c)] \qquad (21)$$

and $$Q_h = \mu[\alpha T_h H + \tfrac{1}{2}H^2\rho - k(T_h - T_c)] \qquad (22)$$

For maximum COP, the optimum value of H is given by:

$$H = \alpha(T_h - T_c)/[\rho(w-1)] \qquad (23)$$

The average cold side temperature $T_c$ can be calculated from equation 19, because the cooling requirement $Q_c$ is specified. Therefore, the four equations 20–23 can be solved simultaneously for the four unknown quantities $T_h$, $Q_h$, μ and H.

Using the simplified method for the problem previously discussed in connection with the xore rigorous method, a value of 24.98 is obtained for H, a value of 302.0 is obtained for μ, and a COP of 0.5039 is obtained. Thus, the error in the COP is less than 3% and the error in μ is less than 5%. For a countercurrent flow configuration, the error will be smaller and for a parallel flow configuration, the error will be larger. Normally, thermoelectric devices and other heat transfer devices avoid the parallel flow configuration because of the high losses due to the second low of thermodynamics. For the other two configurations, the simplified method results in relatively small errors that are usually within acceptable limits. Nevertheless, the more rigorous method is more accurate and dependable and is normally preferred.

The simplified method can also be used to design for the highest cooling capacity (or minimum weight). The procedure is the same as described above, except that the values of $H_1$ and $H_2$ are decreased continuously until the point is reached where the required cooling capacity cannot be obtained for any values of H and μ. Applying this procedure to the problem described previously, it is found that 300 W of cooling can be obtained with $H_1 = 104$, with H=33.47 and μ=318.7. Comparing these values of H and μ with the values 35 and 328 found by the rigorous method, the error in H is about 4.4% and the error in μ is about 2.8%, both well within the range normally considered to be acceptable. Even so, an allowance should be provided in the values of H and μ to account for possible error resulting from following the simplified method.

The key to the simplified method is use of equations 19 and 20 to express the average temperatures on the hot and cold sides of the device, since these equations provide fairly accurate results which cannot be obtained if other methods are used to approximate the temperatures.

It is thus evident that accurate values for the important factors H and μ can be determined by following either the rigorous or simplified methods of the present invention. Therefore, the necessary dimensions of the thermoelectric elements and modules can be selected in order to provide the thermoelectric device with optimum performance capabilities, either for maximum efficiency or maximum capacity. In addition, the performance of devices which are already constructed and operating can be accurately predicted. The simplified method can be used to select values for H and μ, or it can be used as a check to verify the accuracy of the values determined pursuant to the rigorous method.

Although the invention has been described in connection with a thermoelectric device used for cooling, it is equally applicable for heating devices and heat pumps and other devices used both to heat and to cool.

From the foregoing, it will be seen that this invention is one well adapted to attain all the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawing is to be interpreted as illustrative and not in a limiting sense.

Having thus described the invention, I claim:

1. A method of constructing a thermoelectric heating/cooling device which is to have a specified heating/cooling capacity and which includes thermoelectric modules each having a plurality of thermoelectric elements arranged in couples, a process channel on one side of each module for receiving a process fluid at a preselected initial temperature, and a heat exchanger on the other side of each module for receiving a second fluid flowing in a predetermined direction relative to the process fluid at a preselected initial temperature, where the factor $H=I/v$, the factor $\mu=nv$, I is the electric current passing through the elements, $v$ is the ratio of the cross sectional area of each element to its length, and n is the total number of couples in the device, said method comprising the steps of:
expressing the heat balance in the device in terms of a pair of differential equations which recognize the temperature changes of the fluids as they move along the process channel and heat exchanger and which recognize the direction of flow of the second fluid relative to the process fluid;
solving the differential equations to obtain expressions for the outlet temperatures of the process and second fluids in terms of the factors H and $\mu$ and physical properties of the device;
assuming a plurality of different values of H;
assuming a plurality of different values of $\mu$ for each assumed value of H;
calculating the heating/cooling capacity of the device for each set of assumed values of H and $\mu$ based on the solutions to the differential equations;
selecting the value of $\mu$ which provides the specified heating/cooling capacity for each assumed value of H, thereby providing for each assumed value of H a corresponding value of $\mu$ which permits the device to meet the specified heating/cooling capacity;
calculating the coefficient of performance for each assumed value of H and the corresponding value of $\mu$;
selecting the value of H and the corresponding value of $\mu$ which results in the maximum coefficient of performance; and
constructing the thermoelectric heating/cooling device using the values of H and $\mu$ which result in maximum coefficient of performance.

2. A method as set forth in claim 1, wherein the process fluid is cooled and the differential equations are:

$C_1 L(dT_1/dx)/\mu = -\neq T_c H + \frac{1}{2} H^2 \rho + k(T_h - T_c)$
$= H_1(T_c - T_1)/\mu$ and
$C_2 L(dT_2/dx)/\mu = \alpha T_h H + \frac{1}{2} H^2 \rho - k(T_h - T_c) = H_2(T_h - T_2)/\mu$ when the process and second fluids flow generally parallel;
$C_1 L(dT_1/dx)/\mu = \alpha T_c H - \frac{1}{2} H^2 \rho - k(T_h - T_c) = H_1(T_1 - T_c)/\mu$ and
$C_2 L(dT_2/dx)/\mu = \alpha T_h H + \frac{1}{2} H^2 \rho - k(T_h - T_c) = H_2(T_h - T_2)/\mu$ when the process and second fluids flow generally counter; and
$C_1 L_1(\delta T_1/\delta x)/\mu = -\alpha T_c H + \frac{1}{2} H^2 \rho + k(T_h - T_c) = H_1(T_c - T_1)/\mu$ and
$C_2 L_2(\delta T_2/\delta x)/\mu = \alpha T_h H + \frac{1}{2} H^2 \rho - k(T_h - T_c) = H_2(T_h - T_2)/\mu$ when the process and second fluids flow generally perpendicular to one another, where $C_1$ is the heat capacity of the process fluid, $C_2$ is the heat capacity of the second fluid, $H_1$ is the heat transfer rate on the process fluid side of the devide, $H_2$ is the heat transfer rate on the second fluid side of the device, k is the thermal conductivity of each couple, L is the fluid flow length, $L_1$ is the process fluid flow length, $L_2$ is the second fluid flow length, $T_1$ is the process fluid temperature at any location, $T_2$ is the second fluid temperature at any location, $T_c$ is the temperature at any location on the cold side of the modules, $T_h$ is the temperature at any location on the hot side of the modules, x is the coordinate for the process fluid flow direction, y is the coordinate perpendicular to x, $\alpha$ is the Seebeck coefficient of each couple, and $\rho$ is the electrical resistivity of each couple.

3. In a thermoelectric heating/cooling device having a specified heating/cooling capacity to be met, a plurality of thermoelectric elements arranged in couples in thermoelectric modules, a process channel on one side of each module for receiving a process fluid at a predetermined initial temperature, and a heat exchanger on the other side of each module for receiving a second fluid at a predetermined initial temperature, a method of constructing such a device having optimum values for the factors H and $\mu$ where H is defined by the equation $H=I/v$, $\mu$ is defined by the equation $\mu=nv$ I is the current passed through the elements, $v$ is the ratio of the cross sectional area to the length of each element and n is the number of couples in the device, said method comprising the steps of:
solving the differential equations
$C_1 L(dT_1/dx)/\mu = -\alpha T_c H + \frac{1}{2} H^2 \rho + k(T_h - T_c) = H_1(T_c - T_1)/\mu$ and
$C_2 L(dT_2/dx)/\mu = \alpha T_h H + \frac{1}{2} H^2 \rho - k(T_h - T_c) = H_2(T_h - T_2)/\mu$ if the fluids flow generally parallel to one another;
solving the differential equations
$C_1 L(dT_1/dx)/\mu = \alpha T_c H - \frac{1}{2} H^2 \rho - k(T_h - T_c) = H_1(T_1 - T_c)/\mu$ and
$C_2 L(dT_2/dx)/\mu = \alpha T_h H + \frac{1}{2} H^2 \rho - k(T_h - T_c) = H_2(T_h - T_2)/\mu$ if the fluids flow generally counter to one another;
solving the differential equations
$C_1 L_1(\delta T_1/\delta x)/\mu = -\alpha T_c H + \frac{1}{2} H^2 \rho + k(T_h - T_c) = H_1(T_c - T_1)/\mu$ and
$C_2 L_2(\delta T_2/\delta x)/\mu = \alpha T_h H + \frac{1}{2} H^2 \rho - k(T_h - T_c) = H_2(T_h - T_2)/\mu$ if the fluids flow generally perpendicular to one another, where $C_1$ is the heat capacity of the process fluid, $C_2$ is the heat capacity of the second fluid, $H_1$ is the heat transfer rate on the process fluid side of the device, $H_2$ is the heat transfer rate on the second fluid side of the device, k is the thermal conductivity of each couple, L is the fluid flow length, $L_1$ is the process fluid flow length, $L_2$ is the second fluid flow length, $T_1$ is the process fluid temperature at any location, $T_2$ is the second fluid temperature at any location, $T_c$ is the temperature at any location on the cold side of the modules, $T_h$ is the temperature at any location of the hot side of the modules, x is the coordinate for the process fluid flow direction, y is the coordinate perpendicular to x, $\alpha$ is the Seebeck coefficient of each couple, and $\rho$ is the electrical resistivity of each couple;

iteratively determining from the solutions to the differential equations values of H and $\mu$ corresponding values of $\mu$ which permit the device to meet its specified heating/cooling capacity;

calculating the coefficient of performance for each value of H and the corresponding value of and selecting the values which provide the maximum coefficient of performance if the efficiency of the device is to be maximized;

minimizing the values of $H_1$ and $H_2$ if the size and weight of the device are to be minimized; and constructing the device with the value of H and $\mu$ which provide maximum coefficient of performance if the efficiency of the device is to be maximized and with the values of $H_1$ and $H_2$ minimized if the efficiency of the device is to be maximized.

4. In a thermoelectric heating/cooling device having a specified heating/cooling capacity to be met, a plurality of thermoelectric elements arranged in couples in thermoelectric modules each having a cold side and a hot side for respectively extracting heat from a first fluid and transferring heat to a second fluid, a method for constructing such a device with optimum values of H and $\mu$ comprising the steps of:

solving the equation $T_c = T_i - Q_c/(2C_1) - Q_c/H_1$;

solving the equation $T_h = T_a + Q_h/(2C_2) - Q_h/H_2$ simultaneously with the following equations:

$$Q_c = \mu[\alpha T_c H - \tfrac{1}{2}H^2\rho - k(T_h - T_c)];$$

$$Q_h = \mu[\alpha T_h H + \tfrac{1}{2}H^2\rho - k(T_h - T_c)];$$

$$H = \alpha(T_h - T_c)/[\rho(w-1)];$$

where $T_c$ is the average temperature on the cold side of the modules, $T_i$ is the initial temperature of the first fluid, $Q_c$ is the heat capacity of the first fluid, $H_1$ is the heat transfer rate on the cold side of the modules, $T_h$ is the average temperature on the hot side of the modules, $T_a$ is the initial temperature of the second fluid, $Q_h$ is the heat transferred to the second fluid, $C_2$ is the capacity of the second fluid, $H_2$ is the heat transfer rate on the hot side of the modules, $\mu$ is defined by $\mu = n\upsilon$, n is the number of couples in the device, $\upsilon$ is the ratio of the cross sectional area to the length of each element, $\alpha$ is the Seeback coefficient of each couple, H is defined by $H = I/\upsilon$, I is the current passed through the elements, $\rho$ is the electrical resistivity of each couple, k is the thermal conductivity of each couple, and $w = [1 + \alpha^2(T_h + T_c)/(2\rho k)]^{\frac{1}{2}}$; and constructing the thermoelectric heating/cooling device using the values of H and $\mu$ obtained from said solutions.

* * * * *